(12) United States Patent
Noguchi et al.

(10) Patent No.: US 9,224,637 B1
(45) Date of Patent: Dec. 29, 2015

(54) BI-LEVEL DRY ETCHING SCHEME FOR TRANSISTOR CONTACTS

(71) Applicant: SanDisk Technologies Inc., Plano, TX (US)

(72) Inventors: Masato Noguchi, Mie (JP); Keita Kumamoto, Mie (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/468,893

(22) Filed: Aug. 26, 2014

(51) Int. Cl.
*H01L 21/768* (2006.01)
*H01L 21/311* (2006.01)

(52) U.S. Cl.
CPC .... *H01L 21/76802* (2013.01); *H01L 21/31116* (2013.01); *H01L 21/76829* (2013.01)

(58) Field of Classification Search
CPC ............ H01L 21/76802; H01L 21/76829
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 5,864,153 A * | 1/1999 | Nagel | H01L 28/55 257/295 |
| 5,887,145 A | 3/1999 | Harari et al. | |
| 6,011,725 A | 1/2000 | Eitan | |
| 6,046,935 A | 4/2000 | Takeuchi et al. | |
| 7,232,762 B2 * | 6/2007 | Chang | H01L 21/0276 216/46 |
| 7,951,669 B2 | 5/2011 | Harari et al. | |
| 2005/0082602 A1 | 4/2005 | Okajima | |
| 2006/0030109 A1 | 2/2006 | Ranade et al. | |
| 2007/0012979 A1 | 1/2007 | Song et al. | |
| 2007/0057316 A1 | 3/2007 | Yaegashi | |
| 2010/0314679 A1 | 12/2010 | Lee | |
| 2014/0054669 A1 | 2/2014 | Sel et al. | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner* — Yu-Hsi D Sun
(74) *Attorney, Agent, or Firm* — Davis Wright Tremaine LLP

(57) ABSTRACT

Contact holes of different depths for source, drain, and gate connections are formed by common etch steps using a relatively low etch rate material over the gate electrode and a relatively high etch rate material over the source and drain terminals to provide similar etch times for all three holes so that risk of over-etching is reduced.

13 Claims, 7 Drawing Sheets

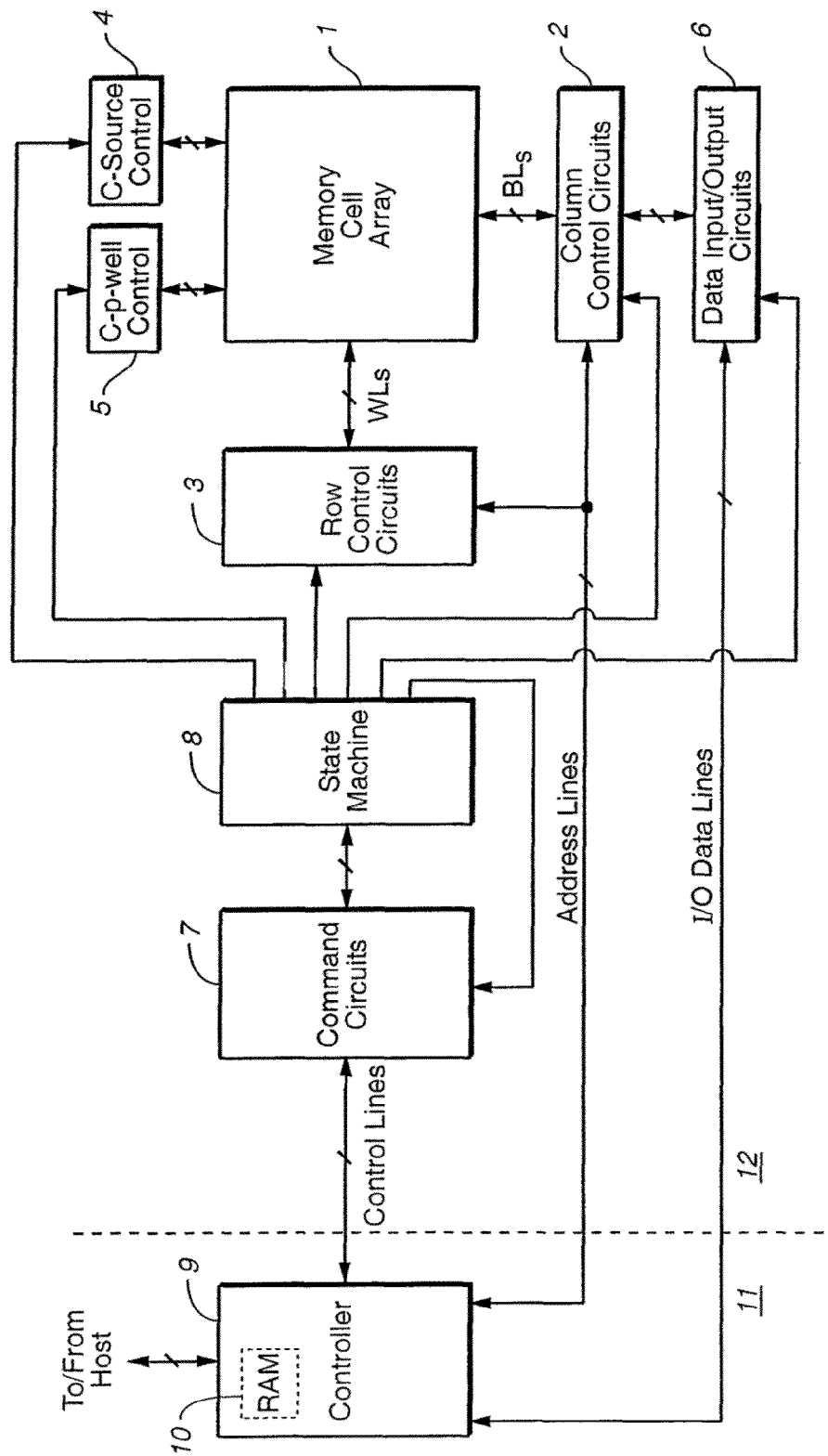
FIG._1
(Prior Art)

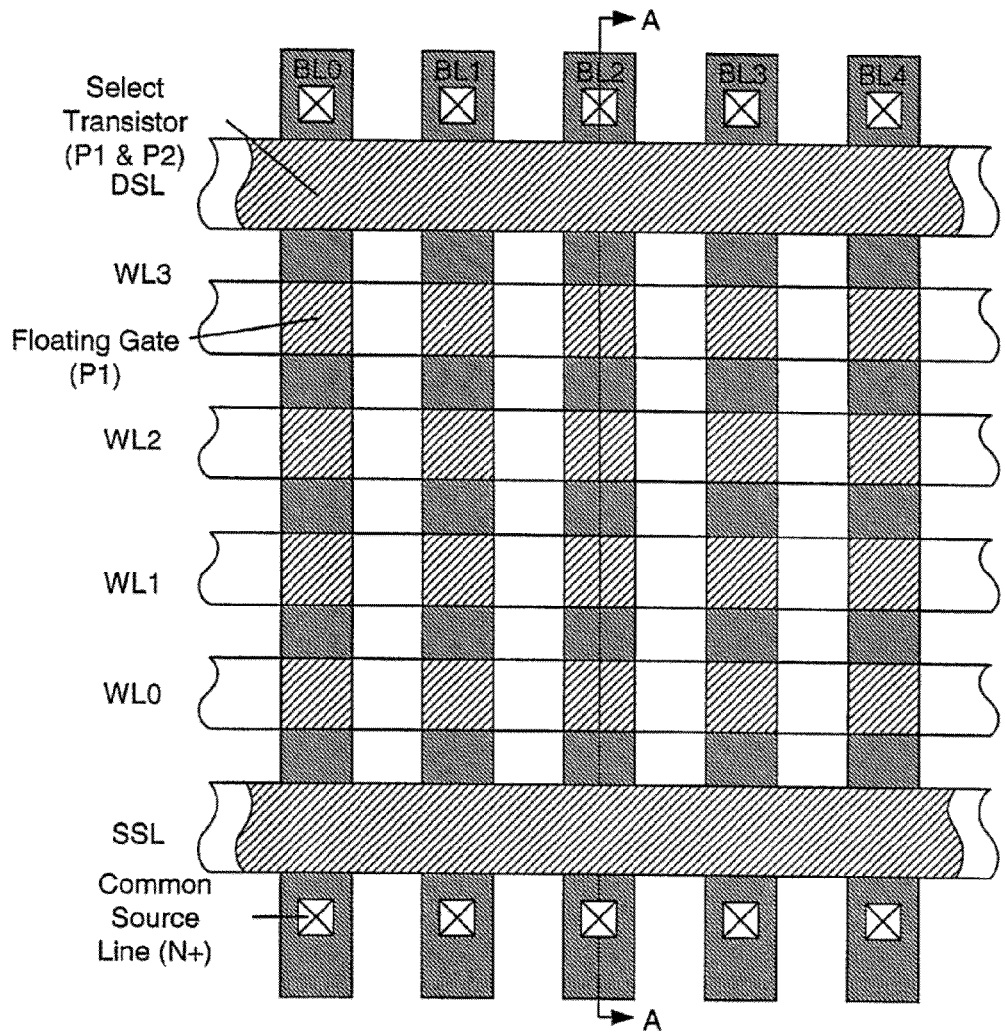
FIG._ 2A *(PRIOR ART)*

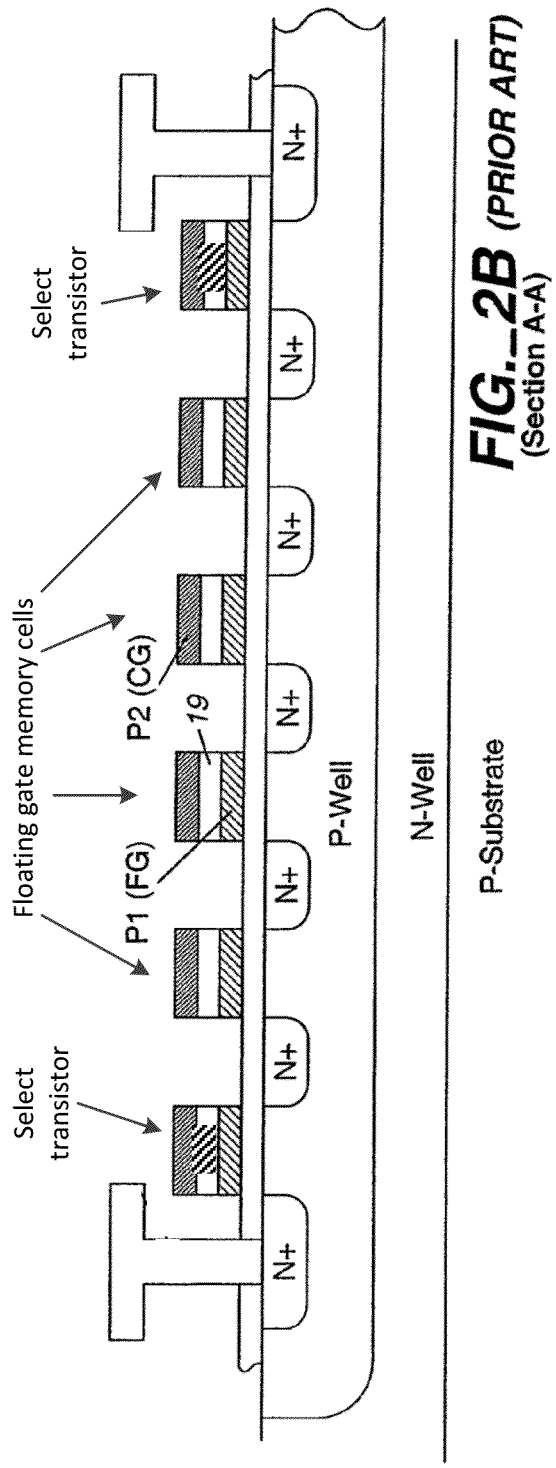
FIG._2B (PRIOR ART) (Section A-A)

BI-LEVEL DRY ETCHING SCHEME FOR TRANSISTOR CONTACTS

BACKGROUND OF THE INVENTION

This invention relates generally to formation, structure, and use of transistors that are formed on substrates, such as NAND flash memory substrates.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

The top and bottom of the string connect to the bit line and a common source line respectively through select transistors (source select transistor and drain select transistor) in which the floating gate material (P1) is in direct contact with the control gate material (P2) through an opening formed in IPD material. The active gate thus formed is electrically driven from the periphery.

Peripheral circuits may also include transistors with active gates that require some contact to be formed to the gate electrode (i.e. the gate is not floating as in memory cells). Formation of contacts for such transistors presents certain problems.

SUMMARY OF THE INVENTION

In some integrated circuits, contact holes for source, drain, and gate connections are formed to different depths. While source and drain contact holes extend down to the substrate surface, the gate electrode is above the substrate surface requiring a shallower contact hole if over-etching and device damage are to be avoided. Different contact holes with different depths are formed by a common sequence of etch steps using a relatively low etch rate material over the gate electrode and a relatively high etch rate material over the source and drain terminals. This provides similar etch times for all three holes to their desired depths so that risk of over-etching is reduced.

An example of a method of forming a transistor includes: forming a gate electrode; subsequently forming a first etch-stop layer over the gate electrode; subsequently forming source and drain areas in the substrate on either side of the gate electrode; subsequently forming a gate electrode insulation layer over the gate electrode, the gate electrode insulation layer formed of a low etch rate material; subsequently forming a second etch-stop layer, the second etch-stop layer lying in contact with the gate electrode insulation layer and in contact with the source and drain areas; subsequently forming a layer of high etch rate material over the second etch-stop layer; subsequently forming an etch mask that defines a first opening over the gate electrode, a second opening over the source area, and a third opening over the drain area; subsequently performing a first etch step that extends the first opening to the second etch-stop layer and extends the second and third openings into the layer of high etch rate material; and subsequently performing a second etch step that extends the first opening through the gate insulation layer to the first etch-stop layer and extends the second and third openings through the layer of high etch rate material to the second etch-stop layer, the second etch step having a very low etch rate for the first and second etch-stop layers.

Forming the gate electrode insulation layer may include depositing silicon dioxide and forming the layer of high etch rate material may include depositing borophosphosilicate glass (BPSG). A pre-metal dielectric layer may be formed over the layer of high etch rate material prior to forming the etch mask, and the first etch step may extend the first, second, and third openings through the pre-metal dielectric layer. The first and second etch-stop layers may be formed of silicon nitride (SiN). A third etch step may etch through the first etch-stop layer in the first opening and etch through the second etch-stop layer in the second and third openings, the third etch step having a significant silicon nitride etch rate. Subsequent to the third etch step, metal may be deposited to form a gate contact, a source contact, and a drain contact in the first, second, and third openings respectively. The gate electrode insulation layer and the high etch rate material may be deposited to thicknesses that provide approximately the same etch time for the second etch step to extend the first opening through the gate electrode insulation layer and to extend the second and third openings through remaining high etch rate material. The second etch step may etch high etch rate material about twice as fast as the second etch step etches the gate electrode insulation layer and the gate electrode insulation layer may be about half as thick as remaining high etch rate material in the second and third openings at initiation of the second etch step. The layer of high etch rate material may be planarized over the second etch-stop layer.

An example of a method of forming a transistor includes: forming a gate electrode of doped polysilicon or metal; subsequently forming a first silicon nitride layer over the gate electrode; subsequently implanting source and drain areas in the substrate on either side of the gate electrode; subsequently forming a silicon dioxide layer over the gate electrode; subsequently forming a second silicon nitride layer, the second silicon nitride layer lying in contact with the silicon dioxide layer over the gate electrode and in contact with the source and drain areas; subsequently forming a silicate glass layer of borophosphosilicate glass (BPSG) or Boron Silicate Glass (BSG) over the second silicon nitride layer; subsequently planarizing the silicate glass layer; subsequently forming a layer of pre-metal dielectric over the silicate glass layer; subsequently forming an etch mask that defines a first opening over the gate electrode, a second opening over the source area, and a third opening over the drain area; subsequently performing a first etch step that extends the first opening to the second silicon nitride layer and extends the second and third openings into the BPSG layer; subsequently performing a second etch step that extends the first opening through the silicon dioxide layer to the first silicon nitride layer and extends the second and third openings through the silicate glass layer to the second silicon nitride layer, the second etch step having a very low etch rate for the first and second silicon nitride layers; and subsequently performing a third etch step that extends the first opening through the first silicon nitride layer to expose the gate electrode, and extends the second, and third openings through the second silicon nitride layer to expose the source and drain areas.

Metal may be deposited to fill the first, second, and third openings and thereby form contacts to the gate electrode, source area and drain area. Forming the silicon dioxide layer may include performing chemical vapor deposition (CVD) using tetraethyl orthosilicate (TEOS). The first etch step may extend the second and third openings into the silicate glass layer to leave a remaining thickness of silicate glass under the second and third openings, and subsequently the second etch step may etch through the remaining thickness of silicate glass in about the same time that the second etch step etches through the silicon dioxide layer.

An example of a transistor includes: a source area in a substrate; a drain area in the substrate; a channel area in the substrate between the source area and the drain area; a gate electrode located over the channel area; a first etch-stop layer overlying the gate electrode; a silicon dioxide layer overlying the first etch-stop layer; a second etch-stop layer overlying the silicon dioxide layer and overlying the source area and the drain area; a planarized silicate glass layer consisting of Boron Silicate Glass (BSG) or borophosphosilicate glass (BPSG) overlying the second etch-stop layer; a pre-metal dielectric (PMD) layer overlying the silicate glass layer; a metal gate contact extending through the PMD layer, the silicate glass layer, the second etch-stop layer, the silicon dioxide layer, and the first etch stop layer to contact the gate electrode; a metal source contact extending through the PMD layer, the silicate glass layer, and the second etch-stop layer to contact the source area; and a metal drain contact extending through the PMD layer, the silicate glass layer, and the second etch-stop layer to contact the drain area.

The substrate may be a NAND flash memory substrate with a NAND array of flash memory cells formed on the substrate.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.
FIG. 2A is a plan view of a prior art NAND array.
FIG. 2B is a cross-sectional view of the prior art NAND array of FIG. 2A taken along the line A-A.

DETAILED DESCRIPTION OF EXEMPLARY EMBODIMENTS

Memory System

Figure 3:
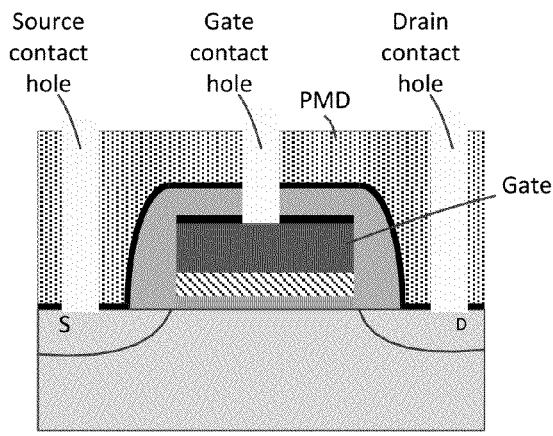
FIG. 3 shows source, drain, and gate contact holes for a transistor in cross section.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG.

1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

In addition to the NAND strings that form the memory array, memory integrated circuits generally include various peripheral circuits that provide access to the memory array as described above. Transistors formed in such peripheral circuits have different requirements to the floating gate transistors of the memory array. However, it is generally desirable to form peripheral transistors and floating gate transistors of the memory array using the same process steps as much as possible. One important difference between peripheral transistors and floating gate memory transistors is that peripheral transistors require some connection to their gate electrodes so that their gates can be appropriately biased. This may be achieved by forming a contact hole that extends down through a dielectric layer, or layers, to expose the gate electrode and then filling the contact hole with metal. Contact to source and drain terminals may also be required and may also be achieved by forming and filling contact holes. In general, it is desirable to form all such contact holes in an efficient way by using a single etch mask followed by anisotropic etching to form source, drain, and gate contacts at the same time.

FIG. 3 shows an example of the formation of source, drain, and gate contacts according to an example of the prior art. In particular, an etch step is performed with a hard mask (not shown) defining three openings, one each for the source, drain, and gate. Anisotropic etching extends the openings downwards through a Pre-Metal Dielectric (PMD) layer and the source ("S"), drain ("D"), and gate electrodes are exposed. However, such a scheme is prone to problems of under and/or over-etching. In particular, it is difficult to have all three holes stop at the right levels so that transistor terminals are exposed but are not damaged.

Figure 4:
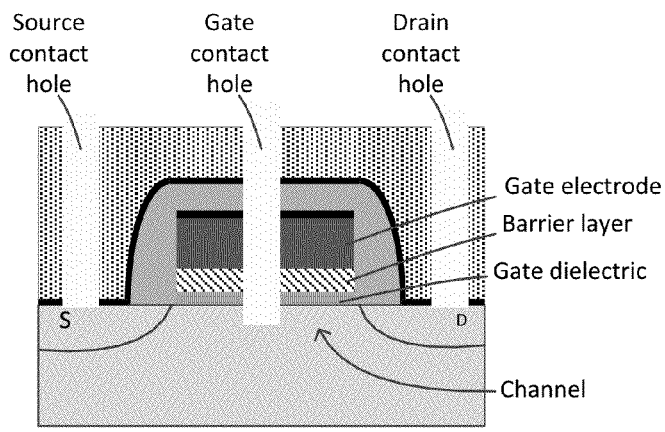
FIG. 4 shows an example of over-etching of a gate contact hole.

FIG. 4 shows an example of damage that may occur during such an etch. In particular, FIG. 4 shows that while contact holes for the source and drain have reached the source and drain terminals without proceeding to damage the source and drain terminals, the gate contact hole has continued through the gate electrode (including a barrier layer between gate metal and gate dielectric) to extend to the channel region and thus destroy the transistor. The geometry of the transistor means that such over-etching of the gate electrode is likely because the gate electrode is closer to the upper surface of the pre-metal dielectric layer and therefore is reached by its contact hole before the source and drain terminals are reached by their respective contact holes. As the source and drain contact holes continue down through the PMD layer, the gate contact hole tends to continue down through the gate electrode. Even where an etch stop layer is provided on the top of the gate electrode, this may etch through after an extended period of time. If the gate contact hole extends too far then the gate dielectric may be damaged, or etched through, and the transistor may become inoperable. While a lower etching time may reduce damage to the gate electrode, it is important that source and drain terminals are fully exposed in order to form a good electrical contact. Under-etching could result in high resistance which could also cause the transistor to be inoperable.

Aspects of the present invention are directed to processes that allow the same series of etch steps to form source, drain, and gate contact holes together in parallel, using the same pattern, without damaging any of the transistor terminals. For example, by using appropriate materials and layer thicknesses to balance etch times, and by using suitable etch-stop layers, aspects of the present invention allow etching deep contact holes for source and drain terminals and shallower contact holes for gate terminals using the same series of etch steps.

Figure 5:
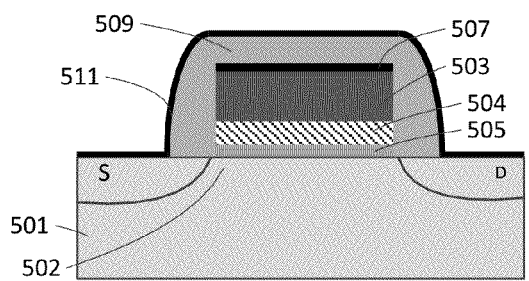
FIG. 5 shows an example of a cross section of a transistor at an intermediate stage of fabrication.

FIG. 5 shows a first cross section of a peripheral transistor according to an example. FIG. 5 shows a substrate 501 in which source terminal ("S") and drain terminal ("D") have been formed by appropriately doping areas of substrate 501 on either side of the channel region 502 under the gate electrode 503. Source and drain regions may be doped after the gate is formed so that they are self-aligned with the gate. A gate dielectric layer 505 insulates the gate electrode 503 from the channel 502. A barrier layer 504 prevents metal of gate electrode 503 from interacting with gate dielectric layer 505 or channel 502. A first etch stop layer 507 overlies the gate electrode 503. Sidewall spacers of silicon oxide are formed on either side of the gate electrode 503 and silicon dioxide overlies the gate electrode forming a gate electrode insulation layer 509. Such silicon oxide may be formed using an appropriate silicon oxide deposition, e.g. by performing chemical vapor deposition (CVD) using tetraethyl orthosilicate (TEOS). The silicon oxide thus formed may be considered a low etch rate material because, when subject to an appropriate etch step, it has a relatively low etch rate. While silicon oxide is an example of such a material, other suitable low etch rate materials may also be used. A second etch stop layer 511 overlies the silicon oxide of gate electrode protection layer 509 and extends over the source and drain terminals in substrate 501. Etch stop layers are formed of silicon nitride (SiN) in the present example though any other suitable material may also be used.

Figure 6:
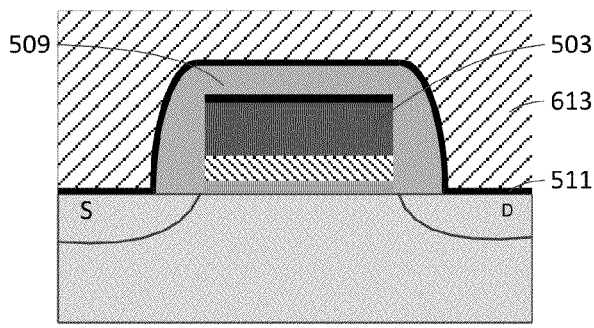
FIG. 6 shows a cross section of the transistor of FIG. 5 after formation of a high etch rate layer.

FIG. 6 shows the structure of FIG. 5 after formation of a high etch rate layer 613 over the transistor. In this example high etch rate layer 613 is formed of a silicate glass such as borophosphosilicate glass (BPSG) or Boron Silicate Glass (BSG). In other examples, other materials may be used. The high etch rate material in this example extends over the second etch stop layer 511 which in turn extends over the source and drain terminals and over the gate structure (over the low etch rate material of gate electrode insulation layer 509 that covers the gate electrode 503). The thickness of the high etch rate layer 613 may be selected to achieve an appropriate thickness over the source and drain terminals and over the gate electrode 503 as discussed further below. High etch rate layer 613 may be planarized (e.g. by Chemical Mechanical Polishing, or CMP) if necessary to provide a substantially flat upper surface.

Figure 7:
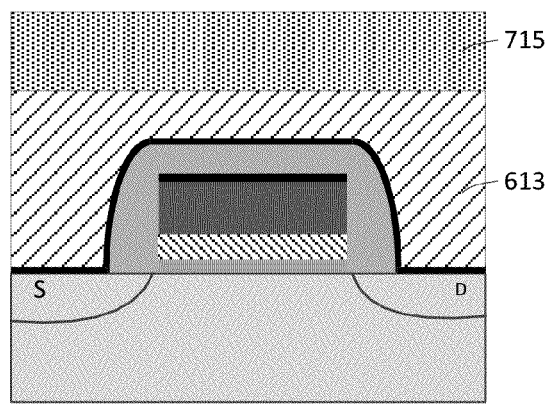
FIG. 7 shows the transistor of FIG. 6 after formation of a Pre-Metal Dielectric (PMD) over the high etch rate layer.

FIG. 7 shows the structure of FIG. 6 after deposition of a Pre-Metal Dielectric (PMD) layer 715 over the high etch rate layer 613. The PMD layer 715 may be formed of a conventional PMD material such as Non-doped Silicate Glass (NSG). PMD layer 715 may be planarized if necessary to provide a substantially flat upper surface and to achieve substantially uniform layer thickness.

Figure 8:
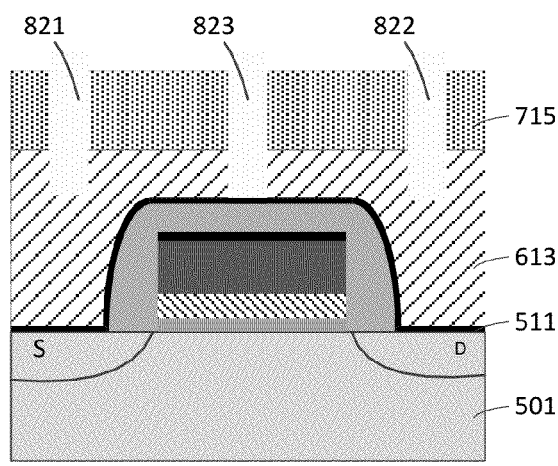
FIG. 8 shows the transistor of FIG. 7 after a first etch step.

FIG. 8 shows the structure of FIG. 7 after a first etch step. An etch mask layer (not shown) may be formed, for example by spinning on resist, and patterned to define openings for contact holes over source, drain, and gate areas. Anisotropic etching, such as Reactive Ion Etching (RIE) may then be used to extend openings down through the PMD layer 715 and into the high etch rate layer 613 to form source contact hole 821, drain contact hole 822, and gate contact hole 823. The gate contact hole 823 stops at second etch stop layer 511 and the source and drain contact holes 821, 822 stop at approximately the same height above the surface of substrate 501. All contact holes 821-823 encounter similar materials in this step (PMD layer 715 and high etch rate layer 613) until gate contact hole 823 encounters second etch stop layer 511 so that contact holes 821-823 are similar in depth. This etch step has a low etch rate for silicon nitride so that second etch stop layer 511, formed of silicon nitride, stops gate contact hole 823. An example of a suitable etch conditions for etching through NSG, BPSG, and/or BSG of PMD layer 715 and high etch rate layer 613 may use a gas mixture that contains one or more of: CF4, CHF3, and C4F8.

Figure 9:
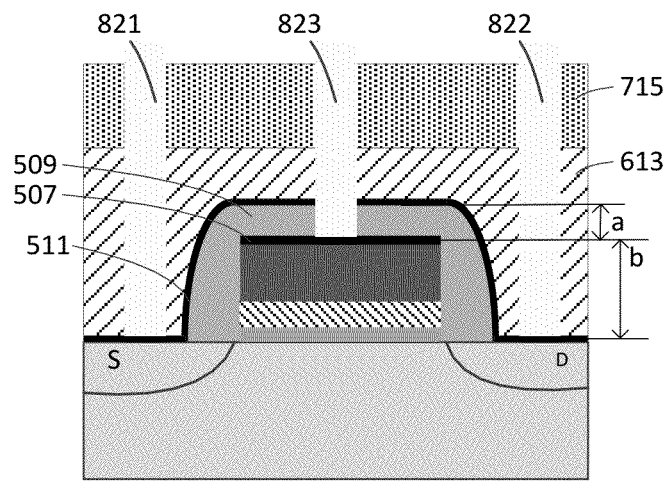
FIG. 9 shows the transistor of FIG. 8 after a second etch step.

FIG. 9 shows the structure of FIG. 8 after a second etch step extends contact holes 821-823. In this etch step, the gate contact hole 823 encounters different materials to the source and drain contact holes 821-822. In particular, while the source and drain contact holes 821-822 are extended by etching through the high etch rate layer 613 the gate contact hole 823 is extended by etching through the low etch rate material of gate electrode insulation layer 509. Gate contact hole 823 may first be extended through second etch stop layer 511 using an etch chemistry that provides a significant etch rate for silicon nitride. For example, a gas mixture comprising one or more of: CF4, O2, and SF6 may be used. The desired result of this etch step is to extend source and drain contact holes 821-822 to second etch stop layer 511 and to extend the gate contact hole 823 to first etch stop layer 507 as shown. Thus, the source and drain contact holes are extended a distance=a+b through high etch rate layer 613 by this step while the gate contact hole 823 is extended a distance=a through low etch rate material of gate electrode insulation layer 509. This result may be achieved for a given combination of materials and etch chemistry by choosing a suitable thickness, a, so that the ratio of etch rates for the high etch rate material to the low etch rate material is in the ratio (a+b)/a. In general, the gate electrode height, b, is determined by desired device characteristics while the height, a, may be varied to achieve the result shown. All contact holes 821-823 end on an etch stop layer so that the danger of over-etching is low. In an example, etching conditions etch silicate glass of high etch rate material layer 613 at two times the rate of silicon oxide of layer 509 so that (a+b)/a=2 provides equal etch times (i.e. a=b). An example of a suitable etch chemistry may include a gas mixture that contains one or more of: CF4, CHF3, and C4F8.

Figure 10:
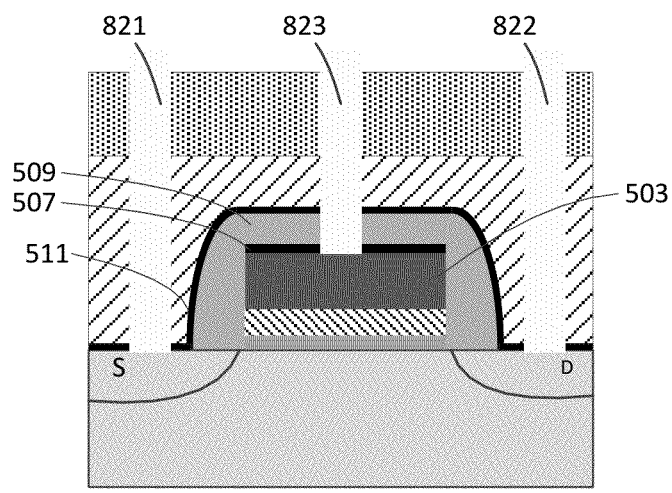
FIG. 10 shows the transistor of FIG. 9 after a third etch step.

Subsequently, as shown in FIG. 10, a third etch step extends the contact holes 821-823 through the etch stop layers to expose the transistor terminals. In particular, the source and drain contact holes 821-822 are extended through second etch stop layer 511 to expose source and drain terminals of the transistor while the gate contact hole 823 is extended through the first etch stop layer 507 to expose the gate electrode 503. An etch chemistry that provides a significant etch rate for silicon nitride may be used in this step. For example, a gas mixture comprising one or more of: CF4, O2, and SF6 may be used. Because this step etches through substantially similar etch stop layers at all three locations, the etching is similar and the chances of over-etching at any one of the locations is small. In particular, the risk of etching through the gate electrode is small.

Subsequent to the formation of contact holes as shown, a suitable conductor such as tungsten or copper may be deposited (with a barrier layer in some examples) to form metal contacts in contact holes 821-823 and to allow the transistor to be connected to other components.

Figure 11:
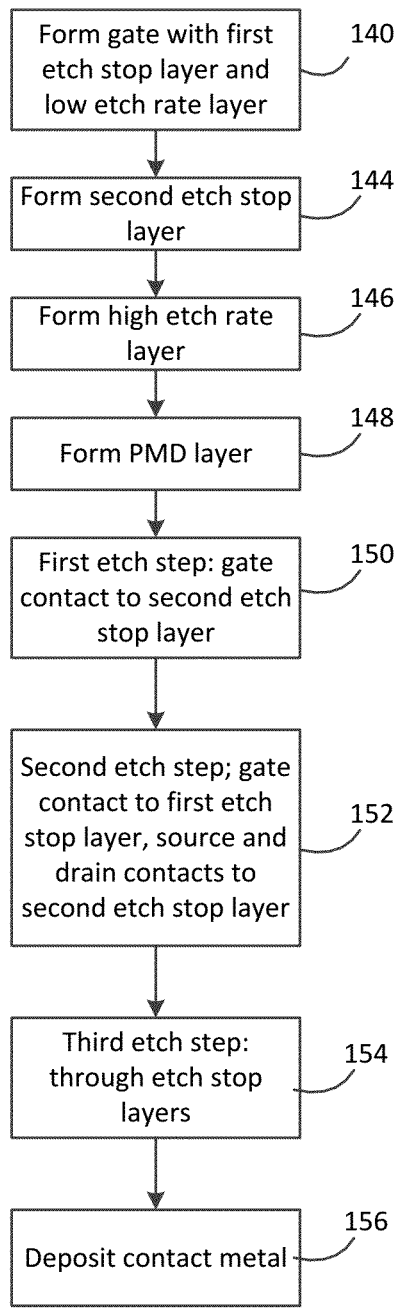
FIG. 11 illustrates an example of a series of process steps used to form contacts.

FIG. 11 illustrates a series of process steps according to an example. A gate is formed (e.g. by depositing gate dielectric and gate electrode materials, patterning and etching) with a first etch stop layer (e.g. SiN) overlying the gate and a layer of low etch rate material (e.g. silicon oxide) over the gate 140. A second etch stop layer (e.g. SiN) is formed over the low etch rate material and extending over the source and drain areas in the substrate on either side of the gate 144. A high etch rate material is then deposited to form a high etch rate layer 146. Subsequently, a PMD layer is deposited over the high etch rate layer 148. After patterning, a first etch step extends the gate contact hole through the high etch rate material to the second etch stop layer 150 while extending source and drain contact holes to a similar level in the high etch rate material. Subsequently, a second etch step extends the gate contact hole through low etch rate material to the first etch stop layer while extending the source and drain contact holes through high etch rate material to the second etch stop layer over the source and drain areas 152. Subsequently, a third etch step extends the contact holes through first and second etch stop layers to expose the source, drain, and gate terminals 154. Metal is then deposited 156 to fill contact holes and form connections to the transistor terminals.

Conclusion

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of forming a transistor comprising:
forming a gate electrode;
subsequently forming a first etch-stop layer over the gate electrode;
subsequently forming source and drain areas in the substrate on either side of the gate electrode;
subsequently forming a gate electrode insulation layer over the gate electrode, the gate electrode insulation layer formed of a low etch rate material;
subsequently forming a second etch-stop layer, the second etch-stop layer lying in contact with the gate electrode insulation layer and in contact with the source and drain areas;
subsequently forming a layer of high etch rate material over the second etch-stop layer;
subsequently forming an etch mask that defines a first opening over the gate electrode, a second opening over the source area, and a third opening over the drain area;
subsequently performing a first etch step that extends the first opening to the second etch-stop layer and extends the second and third openings into the layer of high etch rate material; and subsequently performing a second etch step that extends the first opening through the gate insulation layer to the first etch-stop layer and extends the second and third openings through the layer of high etch rate material to the second etch-stop layer, the second etch step having a very low etch rate for the first and second etch-stop layers.

2. The method of claim 1 wherein forming the gate electrode insulation layer includes depositing silicon dioxide and forming the layer of high etch rate material includes depositing borophosphosilicate glass (BPSG).

3. The method of claim 1 further comprising forming a pre-metal dielectric layer over the layer of high etch rate material prior to forming the etch mask, wherein the first etch step extends the first, second, and third openings through the pre-metal dielectric layer.

4. The method of claim 1 wherein the first and second etch-stop layers are formed of silicon nitride (SiN).

5. The method of claim 4 further comprising applying a third etch step to etch through the first etch-stop layer in the first opening and to etch through the second etch-stop layer in the second and third openings, the third etch step having a significant silicon nitride etch rate.

6. The method of claim 5 further comprising, subsequent to the third etch step, depositing metal to form a gate contact, a source contact, and a drain contact in the first, second, and third openings respectively.

7. The method of claim 1 wherein the gate electrode insulation layer and the high etch rate material are deposited to thicknesses that provide approximately the same etch time for the second etch step to extend the first opening through the gate electrode insulation layer and to extend the second and third openings through remaining high etch rate material.

8. The method of claim 7 wherein the second etch step etches high etch rate material about twice as fast as the second etch step etches the gate electrode insulation layer and wherein the gate electrode insulation layer is about half as thick as remaining high etch rate material in the second and third openings at initiation of the second etch step.

9. The method of claim 1 further comprising planarizing the layer of high etch rate material over the second etch-stop layer.

10. A method of forming a transistor comprising:
forming a gate electrode of doped polysilicon or metal;
subsequently forming a first silicon nitride layer over the gate electrode;
subsequently implanting source and drain areas in the substrate on either side of the gate electrode;
subsequently forming a silicon dioxide layer over the gate electrode;
subsequently forming a second silicon nitride layer, the second silicon nitride layer lying in contact with the silicon dioxide layer over the gate electrode and in contact with the source and drain areas;
subsequently forming a silicate glass layer of borophosphosilicate glass (BPSG) or Boron Silicate Glass (BSG) over the second silicon nitride layer;
subsequently planarizing the silicate glass layer;
subsequently forming a layer of pre-metal dielectric over the silicate glass layer;
subsequently forming an etch mask that defines a first opening over the gate electrode, a second opening over the source area, and a third opening over the drain area;
subsequently performing a first etch step that extends the first opening to the second silicon nitride layer and extends the second and third openings into the BPSG layer;
subsequently performing a second etch step that extends the first opening through the silicon dioxide layer to the first silicon nitride layer and extends the second and third openings through the silicate glass layer to the second silicon nitride layer, the second etch step having a very low etch rate for the first and second silicon nitride layers; and
subsequently performing a third etch step that extends the first opening through the first silicon nitride layer to expose the gate electrode, and extends the second, and third openings through the second silicon nitride layer to expose the source and drain areas.

11. The method of claim 10 further comprising subsequently depositing metal to fill the first, second, and third openings and thereby form contacts to the gate electrode, source area and drain area.

12. The method of claim 10 wherein forming the silicon dioxide layer comprises performing chemical vapor deposition (CVD) using tetraethyl orthosilicate (TEOS).

13. The method of claim 10 wherein the first etch step extends the second and third openings into the silicate glass layer to leave a remaining thickness of silicate glass under the second and third openings, and subsequently the second etch step etches through the remaining thickness of silicate glass in about the same time that the second etch step etches through the silicon dioxide layer.

* * * * *